(12) United States Patent
Brown

(10) Patent No.: US 6,237,007 B1
(45) Date of Patent: May 22, 2001

(54) VERIFICATION OF PORT LIST INTEGRITY IN A HARDWARE DESCRIPTION LANGUAGE FILE

(75) Inventor: Jeffrey R. Brown, Minnetonka, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/110,083

(22) Filed: Jul. 2, 1998

(51) Int. Cl.$^7$ .......................................................... G06F 9/00
(52) U.S. Cl. ................ 707/104; 395/500.06; 395/500.14; 395/500.43; 395/500.34; 364/468.03; 364/468.24; 707/100
(58) Field of Search ........................................ 707/100, 104, 707/200, 2; 395/500.06, 500.14, 500.35, 500.43, 500.34; 364/468.03, 468.28

(56) References Cited

U.S. PATENT DOCUMENTS

| | | | |
|---|---|---|---|
| 5,111,413 | * 5/1992 | Lazansky et al. | 364/578 |
| 5,502,661 | 3/1996 | Glunz | 364/578 |
| 5,519,627 | * 5/1996 | Mahmood et al. | 364/488 |
| 5,544,067 | 8/1996 | Rostoker et al. | 364/489 |
| 5,561,813 | * 10/1996 | Hwang | 710/9 |
| 5,588,142 | 12/1996 | Sharrit | 395/500 |
| 5,691,911 | 11/1997 | Gregory et al. | 364/489 |
| 5,726,902 | * 3/1998 | Mahmood et al. | 364/489 |
| 5,812,417 | * 9/1998 | Young | 364/491 |
| 5,841,663 | * 11/1998 | Sharma et al. | 364/490 |
| 5,870,588 | * 2/1999 | Rompaey et al. | 395/500.34 |
| 5,920,711 | * 7/1999 | Seawright et al. | 395/500 |
| 5,933,356 | * 8/1999 | Rostoker et al. | 364/489 |
| 5,991,523 | * 11/1999 | Williams et al. | 395/500.19 |
| 5,995,730 | * 11/1999 | Blinne | 395/500.04 |

* cited by examiner

Primary Examiner—Jean R. Homere
(74) Attorney, Agent, or Firm—Knobbe, Martens, Olson & Bear, LLP (57) ABSTRACT

A method and computer readable medium are provided for analyzing the integrity of a port list for a component and instantiated modules in a hardware description language file. An example of a hardware description language to which the method and the computer readable medium can be applied is VHDL. The method compares the port lists for a component and associated modules. In the event the component port list and module port list differ, an advisory can be generated to indicated a potential error. The advisory can identify the deviation, and note its location within the hardware description language file. In this manner, the designer can quickly find the port list errors and correct them prior to simulation. Such a port list verification method can significantly reduce the time and effort involved in port list debugging. Consequently, the designer can devote more time and resources to the design effort and the end objective of producing the subject design. In many cases, reduction of debugging costs will bear significantly on the final cost of the design. At the same time, reduction of debugging time can shorten the design cycle.

24 Claims, 6 Drawing Sheets

VERIFICATION OF PORT LIST INTEGRITY IN A HARDWARE DESCRIPTION LANGUAGE FILE

TECHNICAL FIELD

The present invention relates to computer-aided design techniques and, more particularly, to the design of integrated circuitry using hardware description languages.

BACKGROUND INFORMATION

Hardware description languages, such as VHDL (Very High Speed Integrated Circuit Hardware Description Language), are widely used for the design, documentation, and simulation of integrated electronic circuitry. The 1993 version of VHDL is described in IEEE Standard VHDL Language Reference Manual, IEEE Std. 1076-1993. VHDL offers three different modes for the characterization of a complex integrated circuit: structural, data flow, and behavioral descriptions. The VHDL structural description mode focuses on the arrangement of interconnected hardware components, or "blocks," defined by type and interface. The VHDL data flow description mode breaks down the circuit design into a set of register assignments that take place under the control of specified gating ports. The VHDL behavioral description mode defines the design in terms of a series of sequential modules that resemble a high-level programming language. A design can be characterized by a collection of structural, data flow, and behavioral descriptions.

In the VHDL structural description mode, the designer codes various component declarations that provide generic definitions of different hardware components such as multiplexers, latches, and shift registers. Once declared, a component can be instantiated as desired to define particular component instances, or "modules," that form part of the overall integrated circuit design. A component declaration includes a component port list that defines the generic interface to the component, i.e., the input and output ports. A module declaration similarly includes a module port list, but specifies one or more particular signals to be connected to the port interface. Thus, a module, representing an instance of the component, assigns particular signals to the generic port list. In this manner, the module is interconnected with other modules in the overall design.

The human designer generally is required to manually enter the component port lists and module port lists. Unfortunately, the modules and associated port lists within a given design can be difficult to generate and maintain. As a design evolves, for example, the content of the port lists is subject to constant change. Moreover, the changes occur within an extremely complex design having potentially hundreds of modules and port lists that interact with one another. Consequently, maintenance of the module port lists presents a significant challenge.

If a port list is incorrect, the overall design or portions thereof may fail to simulate correctly. In particular, when the module port list omits one or more of the necessary ports, the associated module will not operate properly. Also, the port list error can propagate downstream to other modules that interface with the suspect module. Thus, lack of port list integrity compromises the function of the overall design and causes incorrect simulation.

Identification of the source of the problem, i.e., a defective port list, is a painstaking manual process that can take hours and, in many cases, days. This manual debugging effort can result in substantial delays and drains resources from the design effort, significantly increasing the design cycle and time to market. In the end, port list debugging is a costly nuisance that is difficult to avoid due to design complexity and the prevalence of human error.

SUMMARY

The present invention is directed to a method for analyzing the integrity of a port list for a component instance, or "module," in a hardware description language file. The present invention also is directed to a computer readable medium encoded with a computer program arranged to execute such a method. An example of a hardware description language to which the method can be applied is VHDL.

The method compares a port list for a module that represents an instance of a component to an expected port list. The expected port list can be determined by reference to the port list of the particular component instantiated by the module. In the event the module port list deviates from the expected port list, e.g., the component port list, the integrity of the module port list can be compromised. In this case, an advisory can be generated to identify the deviation and, if desired, note its location within the hardware description language file. In this manner, the designer can quickly find a defective module port list and correct it prior to simulation.

A method configured according to the present invention can significantly reduce the time and effort involved in port list debugging. Consequently, the designer can devote more time and resources to the design effort and the end objective of producing the subject integrated circuit. In many cases, reduction of debugging costs will bear significantly on the final cost of the design. At the same time, reduction of debugging time can shorten the design cycle. Moreover, such a method can simply alleviate the considerable distraction and nuisance incurred by the designer as a result of port list errors.

The present invention, in one embodiment, provides a method for analyzing a port list in a hardware description language file, the hardware description language file declaring components and defining modules representing instantiated components, each of the modules being associated with one of the declared components, wherein each of the declared components includes a component port list and each of the modules includes a module port list, the method comprising accessing the hardware description language file, selecting one of the components from the hardware description language file, selecting one of the modules from the hardware description language file, wherein the selected module is associated with the selected component, extracting the component port list for the selected component, extracting the module port list for the selected module, comparing the extracted component port list and the extracted module port list, and generating an advisory in the event the extracted module port list deviates from the extracted component port list.

In another embodiment, the present invention provides a computer readable medium encoded with a computer program, the program being arranged such that, when the program is executed, a computer analyzes a port list in a hardware description language file, the hardware description language file declaring components and defining modules representing instantiated components, each of the modules being associated with one of the declared components, wherein each of the declared components includes a component port list and each of the modules includes a module port list, the computer performing the acts of accessing the hardware description language file, selecting one of the components from the hardware description language file, selecting one of the modules from the hardware description language file, wherein the selected module is associated with the selected component, extracting the component port list for the selected component, extracting the module port list for the selected module, comparing the extracted component port list and the extracted module port list, and generating an advisory in the event the extracted module port list deviates from the extracted component port list.

In a further embodiment, the present invention provides a method for analyzing a module port list in a hardware description language file, the module port list defining one or more ports for an instantiated component, the method comprising selecting a module port list from a hardware description language file, comparing the selected module port list to an expected port list, and generating an advisory in the event the selected module port list deviates from the expected port list.

In an added embodiment, the present invention provides a computer readable medium encoded with a computer program, the program being arranged such that, when the program is executed, a computer analyzes a module port list in a hardware description language file, the module port list defining one or more ports for an instantiated component, the computer performing the acts of selecting a module port list from a hardware description language file, comparing the selected module port list to an expected port list, and generating an advisory in the event the selected module port list deviates from the expected port list.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
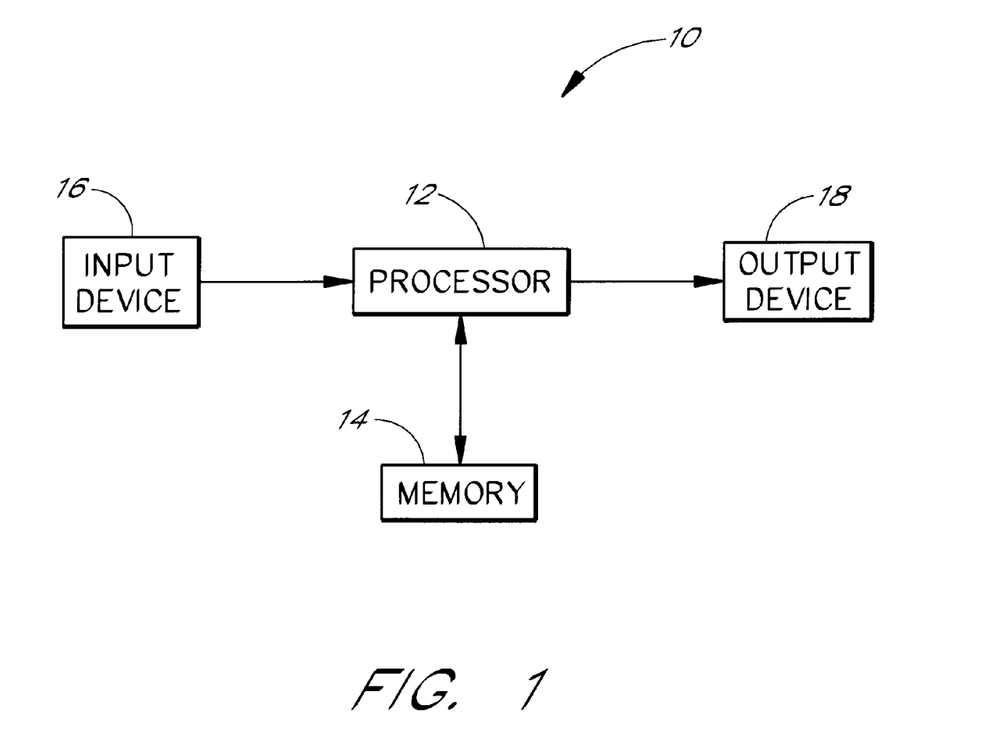
FIG. 1 is a functional block diagram of a system implementing a method for analyzing the integrity of a port list in a hardware description language file.

FIG. 1 is a functional block diagram of a system 10 implementing a method for analyzing the integrity of a port list in a hardware description language file in accordance with an embodiment of the present invention. As shown in FIG. 1, system 10 may include a processor 12, memory 14, an input device 16, and an output device 18. Memory 14 may include random access memory (RAM) storing program code that is accessed and executed by processor 12. The program code can be loaded into memory 14 from another memory device, such as a fixed hard drive or removable media device associated with system 10. Processor 12 may take the form of any conventional general purpose single- or multi-chip microprocessor such as a Pentium® processor, a Pentium Pro® processor, an 8051 processor, a MIPS processor, a Power PC® processor, or an Alpha® processor. In addition, processor 12 may be any conventional special purpose microprocessor. Input device 16 may include a conventional keyboard and pointing device such as a mouse or trackball, if desired. Output device 18 may include a computer monitor, such as a CRT or flat panel display, that provides textual and/or graphic output to the user. Further, processor 12, memory 14, input device 16, and output device 18 may be integrated with or form part of a personal computer or computer workstation.

The program code stored in memory 14 can be arranged such that, when executed, processor 12 analyzes the integrity of a port list in a hardware description language file. In particular, processor 12 analyzes a port list for a component instance, or "module." The hardware description language file includes component declarations, such as VHDL component declarations. Each component declaration includes a component port list that defines an external interface to the component. The hardware description language file also may include a data flow description for each component. The data flow description describes the internal functionality of the component. For each component, the hardware description language file may include several instances, or "modules," each of which includes a module port list.

The module port list ideally includes the same ports as the component port list, and further specifies particular signals that are assigned to the ports. In this manner, the module port list defines the interconnection of the respective module with other modules in the design, effectively plugging the module into the design. If the module port list omits one or more ports from the component port list or fails to assign signals to the ports, the module can fail to operate properly, resulting in errors during simulation. Moreover, the errors can propagate downstream to other modules that are connected to the module ports.

The module port list can be analyzed by comparing it to an expected port list. The expected port list can be determined by reference to the port list of the particular component that is instantiated by the module. The component port list defines a generic interface for a component, and is set forth by the designer in the component declaration. The module port list is the port list defined by the designer for a particular component instance. Accordingly, the module port list ideally should conform to the component port list, but further assign particular signals to the specified ports. In the event the module port list deviates from the component port list, processor 12 generates an advisory. The advisory may convey information sufficient to identify the deviation and, if desired, note its location within the hardware description language file. In this manner, the designer can quickly find a defective module port list and correct it prior to simulation.

To verify the integrity of the module port list, the program code can be arranged such that processor 12 accesses a hardware description language file, such as a VHDL file. The hardware description language file can be loaded into memory 14, for example, from a fixed hard drive or removable media storage device, for access by processor 12. The program code may allow the user to select a particular hardware description language file via input device 16 in conjunction with the textual and/or graphic output provided by output device 18. Alternatively, the program code may be arranged such that processor 12 accesses a set of hardware description language files provided in a particular directory or folder. It is common that a particular design will be characterized by a long list of hardware description language files, all of which can be analyzed together for port list integrity.

The program code can be provided as a discrete application that is invoked by the user to analyze the hardware description language files, or integrated with a hardware description language design application such as a VHDL editor. An example of a VHDL editor is CodeWright 5.0 for Windows, commercially available from Premia Corporation. An example of a hardware description language compilation and simulation package is ModelSim (PE)/Plus 4.7, commercially available from Model Technology. The program code can be written in any script or programming language, and be written to execute in a matter of seconds. The application can be called by the push of a button, a mouse click, or otherwise, from whatever application is being used to edit the hardware description language code. The program code can be carried on a computer-readable data storage medium such as a fixed disk, a removable disk, or tape, and can be loaded into memory 14 as needed for access by processor 12.

According to the program code, processor 12 can select each of the module port lists in a hardware description language file, and generate expected port lists for them. An expected port list contains one or more names including the names of particular ports that are expected to be included in the interface of the selected module. The program code can be arranged such that processor 12 generates an expected port list for each module port list upon selection of the module port list, i.e., in an "on the fly" mode. Alternatively, processor 12 can generate component port lists for each of the modules in advance of the selection and comparison routine. As will be explained, the expected port list can be assembled by reference to the port list for the component instantiated by the module. Although the program code can be arranged to allow individual selection of module port lists to be analyzed, in most cases the user will prefer that all modules be analyzed in a single analysis routine. Indeed, as mentioned above, it is expected that a user will prefer to have all modules for several hardware description language files analyzed in a single analysis routine.

For each module port list, processor 12 verifies whether the port name or names in the expected port list are present in the actual module port list. In the event one or more port names is absent from the actual module port list, processor 12 can be configured to generate an advisory. The advisory may take the form of a simple error message that can be immediately communicated to the user as an advisory, or logged for later communication with all module port list errors discovered within a hardware description language file or set of files. In most cases, it will be desirable to present all error messages together following completion of the analysis routine, or at least following analysis of each hardware description language file. To provide more meaningful output, processor 12 can generate with each advisory a set of information sufficient to identify the suspect module port list.

The program code preferably is further arranged such that processor 12 not only identifies the suspect module port list, but also specifies the particular port that has been omitted. In particular, processor 12 can produce, via output device 18, a textual and/or graphic representation of a portion of a hardware description language file that identifies the potential module port list errors. Processor 12 can allow a user, in conjunction with input and output devices 16, 18, to view advisories indicative of module port list errors within a given hardware description language file. For example, processor 12 can provide scrolling, indexing, or hypertext linking capabilities that enable a user to move between modules yielding suspect module port lists. Thus, the presentation of the errors can be consecutive relative to the order of appearance in the file, or indexed or linked according to groups of ports or modules sharing common characteristics. Processor 12 can present, for example, a list of modules having suspect module port lists by name, and allow the user to hypertext link to a selected module in the list to view the potential module port list error. Alternatively, the user can carry out a simple scrolling function between consecutive modules.

The modules can be represented in a conspicuous manner, e.g., by highlighting or redlining, to identify the potentially problematic module port list for the user. If desired, the missing port name also can be inserted into the module port list in a highlight or redline mode. Presence of the missing port in the expected port list, e.g., the port list for the component instantiated by the module, provides an indication that the port also should be present in the module port list. Thus, the missing port also can be identified in a component, which can be simultaneously displayed with the subject module. In this manner, the user can more immediately understand the context in which the port is declared, and determine whether it should be added to the module port list or whether the component port list is in error or should be changed. With a convenient listing of potential module port list errors, a user can minimize the time and effort spent in manual debugging. As described above, the mode by which the module port list errors are presented and organized will be subject to variation. Accordingly, it may be desirable to incorporate a number of presentation options for individual selection or combination on a user preference basis.

The program code, in a further embodiment, also can be arranged to verify the presence of "extra" ports in the module port list. In other words, in addition to verifying whether each of the names in the expected port list is present in the actual module port list, processor 12 also can perform a converse verification routine. Specifically, processor 12 can verify whether each of the names in the actual module port list is present in the expected port list. Identification of extra names present in the actual module port list and missing from the component port list will serve to identify superfluous names that have been inadvertently added to the actual module port list. An extra port name will cause the module to simulate improperly and, in most cases, result in compilation errors. Therefore, arrangement of the program code to identify "extra" ports named in the actual module port list may be desirable. If such extra port names are detected, processor 12 can generate an appropriate advisory conveying, if desired, the identification and location of the particular module port list and port name for ready correction by the user, substantially as described above with respect to missing port names.

The program code in memory 14 can be arranged, in a further embodiment, to correct suspect module port lists in an automated manner. For example, in combination with identifying those missing port names that are omitted from the actual module port list and/or those extra port names that are inadvertently included in the actual module port list, processor 12 can be configured to automatically correct the discrepancies, at least in part. In particular, processor 12 can add a missing port name to the actual module port list, or delete an extra port name from the actual module port list. The correction can be undertaken automatically without user intervention based on the content of the expected port list. In this case, the user should have a high degree of confidence in the accuracy of the expected port list. If the expected port list is generated with a high degree of accuracy, as will be described herein, the user may be comfortable with automatic correction.

In many cases, regardless of the accuracy of the expected port list, the user will desire the opportunity to approve each correction in advance, inasmuch as the correction alters the code. Moreover, the user ordinarily will need to intervene in the correction process to some degree in order to assign a particular signal to a newly added port. Thus, processor 12 can step through a set of suspect module port lists under user control, like the spell check or find-and-replace functions of a conventional word processing program, providing suggested corrections for user approval. The suggested corrections can be displayed within a representation of the module port list on output device 18, or in a modal window displayed on the output device that conveys a proposed correction and seeks user approval. Upon user approval, e.g., by a mouse click or other manipulation of input device 16, processor 12 would proceed to enter the correction and alter the contents of the hardware description language file code as appropriate. Before proceeding to the next proposed correction, however, processor 12 can wait for user input specifying the particular signal to be connected to the port.

Figure 2:
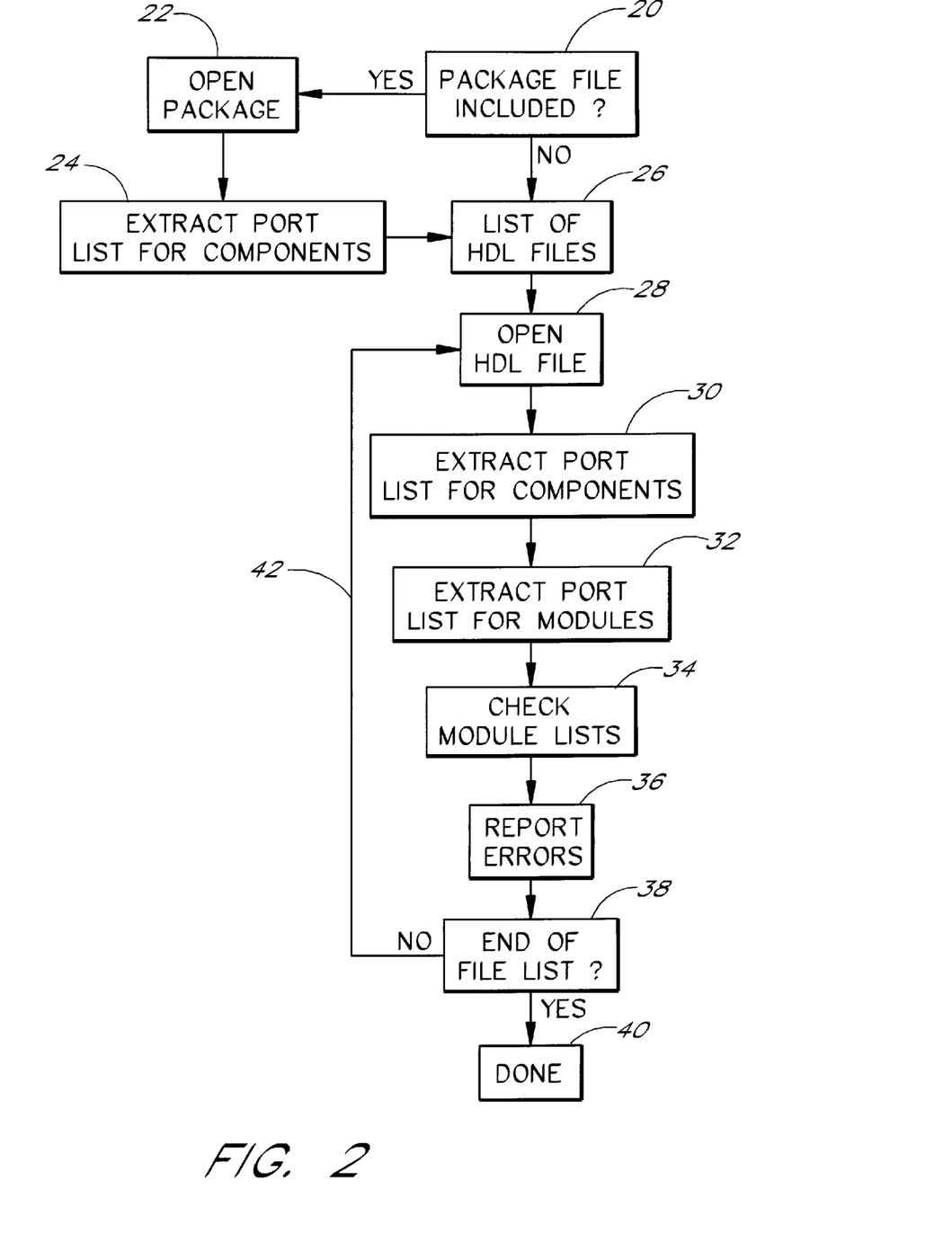
FIG. 2 is a flow diagram illustrating the operation of a method for analysis of the integrity of a port list in a hardware description language file.

FIG. 2 is a flow diagram illustrating the operation of a method for analysis of the integrity of a module port list in a hardware description language file. As indicated by block 20, processor 12 determines whether the hardware description language file or files include an associated package file. A package file sets forth the components declared in the hardware description language files for a particular design. If a package file is included, processor 12 opens it, as indicated by block 22, and extracts the port lists associated with the respective components, as indicated by block 24. In this example, the component port lists serve as the expected port lists for modules that instantiate the respective components. After extracting the component port lists, processor 12 accesses the pertinent list of hardware description language (HDL) files, as indicated by block 26. If a package file is not found in the query indicated by block 20, processor 12 proceeds directly to the list of hardware description language files, indicated by block 26. As indicated by block 28, processor 12 selects and opens one of the hardware description language files.

After the hardware description language file has been loaded, e.g., from a fixed hard drive or removable media drive, processor 12 accesses the contents of the file. If the component port lists were not extracted from a package file, processor 12 extracts them directly from the hardware description language file, as indicated by block 30. Also, processor may extract from the hardware description language file port lists for those components that may not have been set forth in the package file. In particular, processor 12 scans the components listed in the hardware description language file, and assembles port lists for each of them. In a similar manner, processor 12 extracts the port lists provided for each module in the hardware description language file, as indicated by block 32. Processor 12 then "checks" the module port lists for errors such as missing or extra ports, as indicated by block 34. In this manner, processor 12 verifies the integrity of each of the module port lists set forth in the hardware description language file.

To check the module port lists, in this embodiment, processor 12 compares them to port lists associated with components instantiated by the respective modules. In this manner, the component port lists act as the expected port lists. Following the comparison, processor 12 reports any errors to the user, as indicated by block 36. Again, the errors can be reported immediately, but preferably are logged for communication to the user following analysis of the entire hardware description language file or files. After analyzing all of the module port lists in a given hardware description language file, processor 12 determines whether it has reached the end of the list of files, as indicated by block 38. If so, processor 12 terminates the analysis routine, as indicated by block 40. If other hardware description language files remain, however, processor 12 repeats the analysis routine for each of them, as indicated by loop 42.

Figure 3:
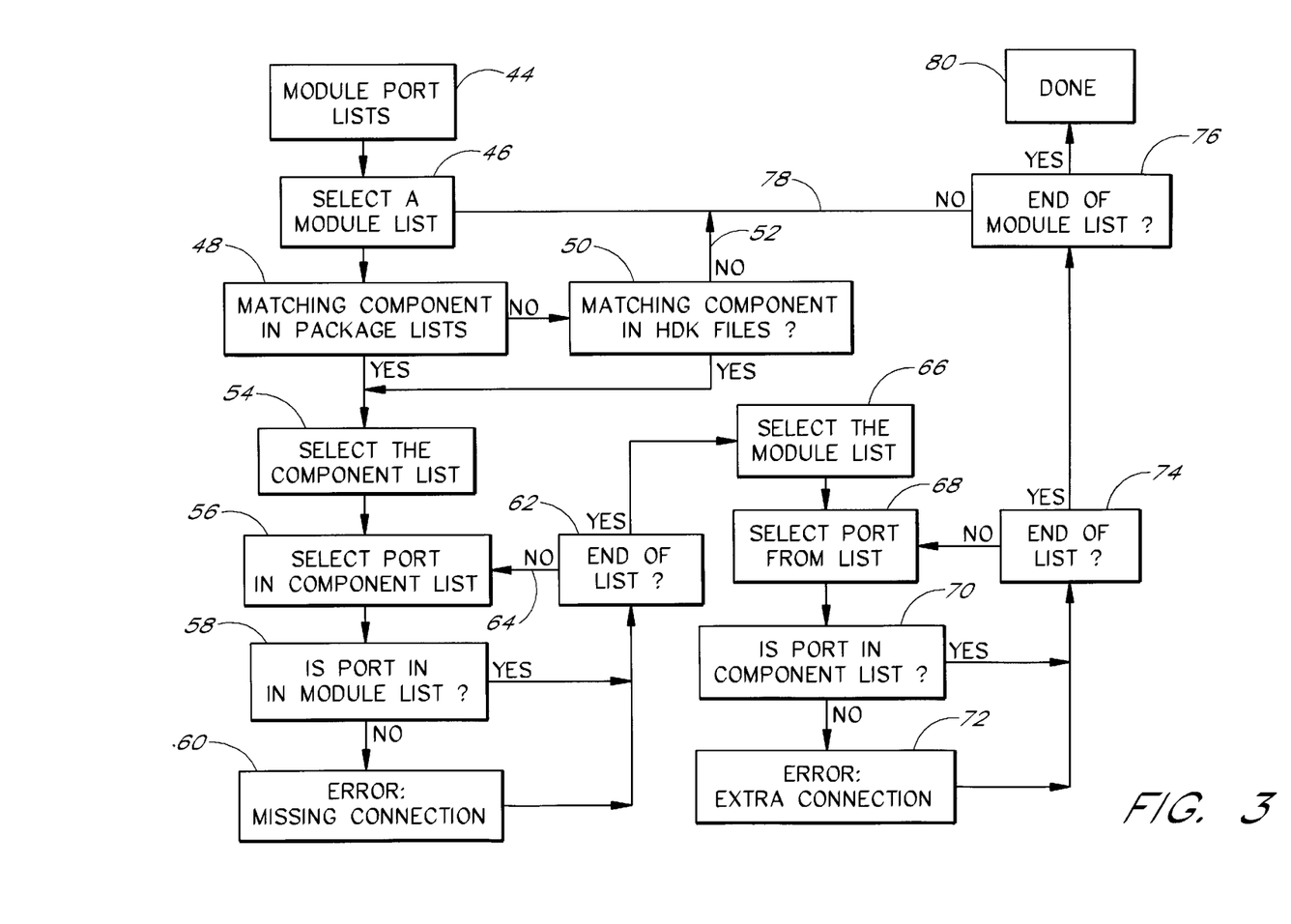
FIG. 3 is a flow diagram illustrating operation of a method as shown in FIG. 2 in greater detail.

FIG. 3 is a flow diagram illustrating operation of a method as shown in FIG. 2 in greater detail. In particular, FIG. 3 illustrates the analysis of the module port lists within a given hardware description language file. As shown in FIG. 3, processor 12 scans the list of module port lists in the hardware description language files, as indicated by block 44, and selects one of them for analysis, as indicated by block 46. As indicated by block 48, processor 12 then attempts to identify a matching component in the list of components in the package file, i.e., the particular component instantiated by the selected module. In this embodiment, the port list associated with the matching component will serve as the expected port list for the integrity analysis. If there is no corresponding component in the package file, processor 12 determines whether a matching component has been identified in the hardware description language file, as indicated by block 50. If not, processor 12 has no basis for comparison of the selected module port list. In other words, an expected port list in the form of a port list for the component instantiated by the module is unavailable. Accordingly, processor 12 returns to select another module port list for analysis, as indicated by loop 52 and block 46.

If processor 12 identifies a matching component in the package list or the hardware description language files, it selects the port list for that component, as indicated by block 54. With the port list for the matching component, processor 12 first analyzes the module port lists for missing ports, or "connections." Specifically, processor 12 selects one of the ports from the component port list, as indicated by block 56, and determines whether the selected port is included in the port list for the selected module, as indicated by block 58. If the module port list does not include the selected port, processor 12 logs a missing "connection" error, as indicated by block 60. In either case, processor 12 determines whether it has reached the end of the component port list, as indicated by block 62. If not, processor 12 selects another port from the component port list, as indicated by loop 64 and block 56, and repeats the comparison and error reporting operations indicated by blocks 58 and 60 relative to the selected module port list. This process continues until processor 12 has analyzed the module port list for presence of each of the ports set forth in the matching component port list.

Once all port names in the component port list have been verified for presence in the module port list and errors have been logged for missing ports as appropriate, processor 12 next proceeds to verify the presence of extra ports in the module port list. In other words, processor 12 determines whether the actual module port list includes additional port names that are not present in the corresponding component port list. With further reference to FIG. 3, processor 12 selects the port list for the module under analysis, as indicated by block 66, and selects one of the ports in the selected module port list, as indicated by block 68. Processor 12 then determines whether the selected port from the module port list is present in the port list for the matching component, as indicated by block 70. If not, processor 12 logs an extra connection error, as indicated by block 72. In this case, the module port list includes an extra port that is not present in the component port list. Errors logged by processor 12 (blocks 60, 72) can be stored and communicated together following completion of the verification routine for all module port lists in the hardware description language file. The errors can be logged by entry into a separate error file, or by modifying the contents of the subject hardware description file to identify the errors.

Following analysis of a particular port, processor 12 determines whether it has reached the end of the module port list, as indicated by block 74, i.e, the last port in the module port list. If additional ports remain, processor 12 repeats the comparison and error reporting routine indicated by blocks 70 and 72. After analyzing each of the ports in the module port list, processor 12 determines whether it has reached the end of the module component lists, as indicated by block 76. If not, processor 12 selects the next module port list, as indicated by loop 78 and block 46, and repeats the analysis for missing and extra ports for the selected module port list. If processor 12 has analyzed all of the module port lists, however, it terminates the routine, as indicated by block 80. Although the verification method has been described with respect to FIG. 3 as involving verification of all of the module port lists for all of the hardware description language files in a file list, the method may be implemented to process a subset of files and/or a subset of module port lists within a file. In this manner, the user can specify those files and/or lists to be analyzed.

Figure 4:
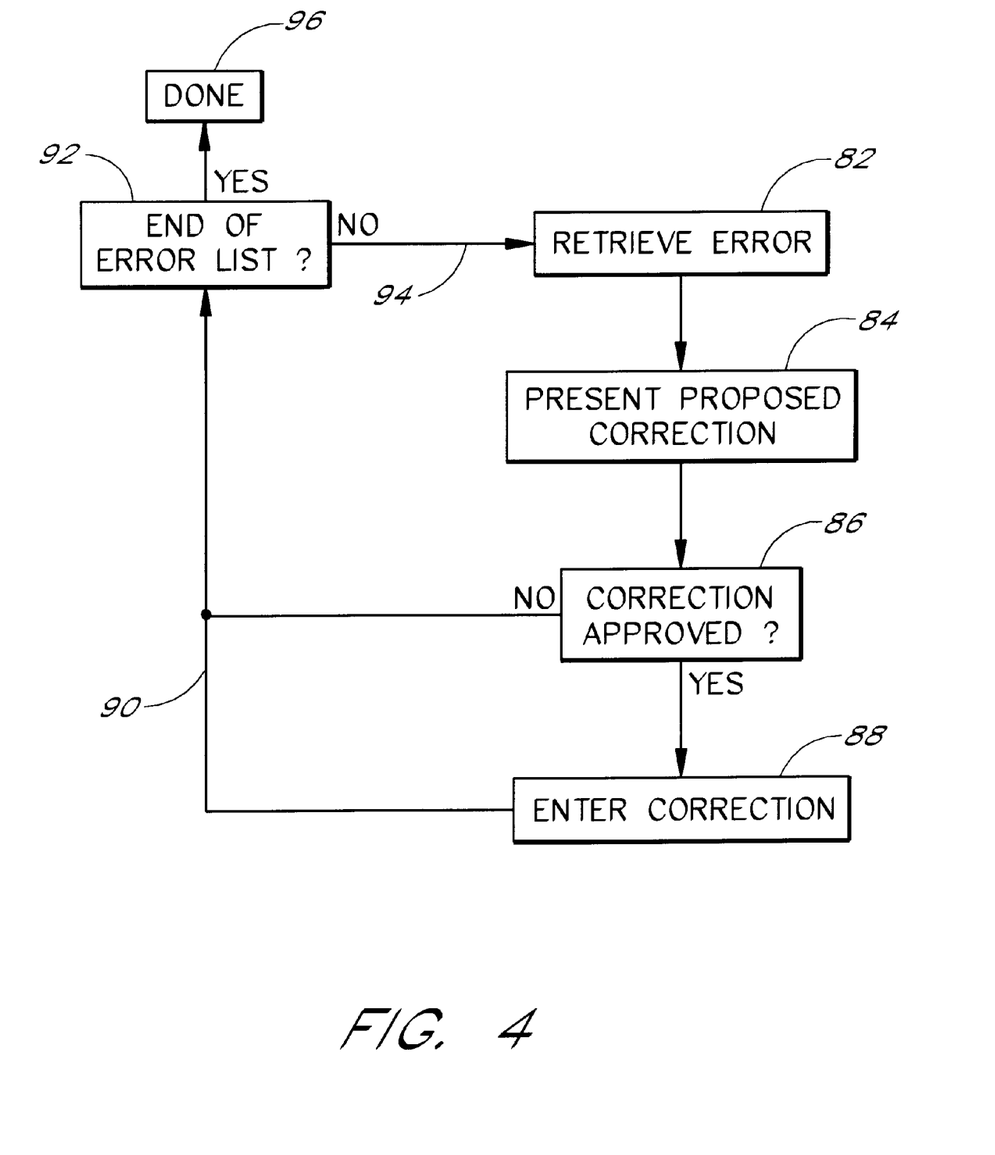
FIG. 4 is a flow diagram illustrating a correction routine for use in a method as shown in FIGS. 2 and 3.

FIG. 4 is a flow diagram illustrating a correction routine for use in a method as shown in FIGS. 2 and 3. Specifically, as shown in FIG. 4, processor 12 can be configured to carry out a routine whereby errors logged in a method as shown in FIGS. 2 and 3 are automatically corrected, or at least corrected subject to user approval. For example, processor 12 can retrieve an error file or errors identified within a pertinent hardware description file, as indicated by block 82, and present corrections for the errors sequentially, as indicated by block 84. The errors can be presented in an error list or in the context of the hardware description language file in which they occur. In particular, processor 12 can drive output device 18 to display a representation of the hardware description language file with scrolling, indexing, or hypertext link capabilities as previously described. With each error, processor 12 can select an appropriate correction by reference to the component port list. For example, if a port name is present in the component port list and missing from the actual module port list, processor 12 can present via output device 18 a proposed correction in which the missing port name is added to the actual module port list. If a port name is present in the actual module port list but missing from the component port list, processor 12 can drive output device 18 to present a proposed correction in which the extra port name is deleted from the actual module port list.

As indicated by block 86, processor 12 can allow the user to indicate whether the proposed correction is accepted, for example, by the click of a pointing device or a keyboard entry. If the user accepts the proposed correction, processor 12 enters the correction into the hardware description language file under scrutiny, as indicated by block 88. If the correction involves the addition of a missing port, processor 12 can prompt the user for entry of a signal connection for the port. If the user does not accept the proposed correction, or following entry of an approved correction, processor 12 can determine whether it has reached the end of the error list, as indicated by loop 90 and block 92. Also, the program code can be arranged to allow the user to override the proposed correction in favor of a user-specified correction. In other words, processor 12 may allow the user to enter a correction for each error without regard to the suggestions drawn from the component port list. If processor 12 has not reached the end of the error list, it repeats the process, as indicated by loop 94, and presents the next potential module port list error to the user. If the end of the error list has been reached, processor 12 terminates the error correction process, as indicated by block 96, or proceeds to another hardware description language file for which module port list errors have been logged.

Figure 5:
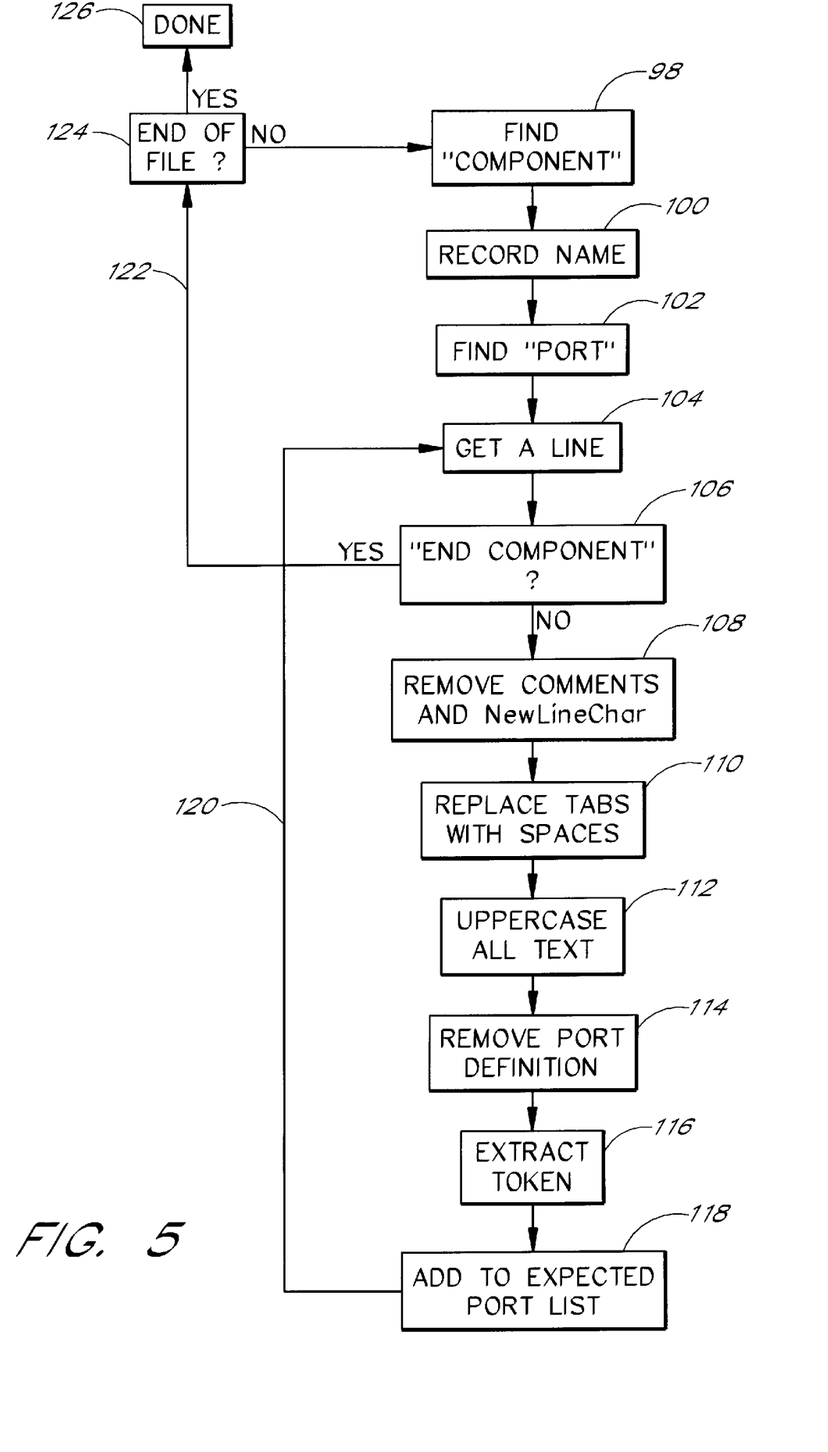
FIG. 5 is a flow diagram illustrating a method for extracting a component port list for use in a method as shown in FIGS. 2 and 3.

FIG. 5 is a flow diagram illustrating generation of an expected port list for use in a method as shown in FIGS. 2 and 3. To analyze module port list integrity as described with reference to FIGS. 2 and 3, it is necessary to generate an expected port list. In this embodiment, the port list of a component instantiated by the respective module serves as the basis for the expected port list. In essence, processor 12 filters out extraneous characters to reduce the component declaration to a list of port names. A component port list can be generated for each module port list as it is selected for analysis by processor 12. However, processor 12 preferably generates expected port lists for a number of actual module port lists in advance of the verification process. In either case, the component port list can be generated substantially as shown in the example of FIG. 5. First, processor 12 identifies a component in a package file or hardware description language file by finding the keyword "component," as indicated by block 98. For ease of description, an example of a component declaration is set forth below:

```
component CompX
    Port (
        A_in: in std_logic_vector(3 downto 0);      --A
        B_out: buffer std_logic                      --B
    );
end component;
```

After identifying a component, processor 12 records its name, as indicated by block 100. In the above example, processor 12 records the name "CompX." As indicated by block 102, processor 12 next identifies the "port" statement within the component declaration. Processor 12 then gets from the component declaration a line of code following the port statement, as indicated by block 104. In a first iteration, processor 12 gets the first line following the "port" statement. In subsequent iterations, processor 12 gets successive lines. Processor 12 next determines whether the line contains the "end component" statement, as indicated by block 106. In a first iteration, with the example component declaration above, processor 12 obtains the following:

```
A_in: in std_logic_vector(3 downto 0);      --A
```

The "end component" statement would indicate that no further lines remain in the body of the module, and typically would be separated from the "port" statement by one or more lines of code. If the next line is not the "end process" statement, processor 12 next removes all comments and new line characters, as indicated by block 108. Comments can be identified in the exemplary convention of the above component by reference to the "—" characters. After removing comment and new line characters, processor 12 yields the following remaining characters:

A_in: in std_logic_vector(3 downto 0);

As indicated by block 110, processor 12 replaces all tabs with spaces, as applicable. In the above example, it is assumed that the line of code included two tabs that are converted to spaces. Processor 12 next converts all remaining text to uppercase, as indicated by block 112, yielding:

A_IN: IN STD_LOGIC_VECTOR (3 DOWNTO 0);

Processor 12 then removes the port definition, as indicated by block 114, by reference to the definition operator, which is ":" in this example. Thus, processor 12 removes all characters to the right of the ":" character, such that the line of code is reduced to:

A_IN

With the component declaration reduced as described above, processor 12 readily extracts the remaining code as a token representative of a port, as indicated by block 116, and adds the token to the expected port list, as indicated by block 118. In this example, the token is "A_IN." Addition of the token to the expected port list establishes it as a port for verification against the module port list in the port list analysis routine.

Following addition of the token to the expected port list, processor 12 returns for another extraction cycle, as indicated by loop 120. In a second extraction cycle directed to the component declaration of this example, processor 12 repeats the acts indicated by blocks 104, 106, 108, 110, 112, 114, 116, and 118 to extract the "B_OUT" token and add it to the expected port list. The resulting expected port list in this example is "A_IN, B_OUT." Accordingly, the module port list for a module that instantiates the particular component should include connections for the two port names "A_IN, B_OUT."

In a third extraction cycle, processor 12 obtains the "end component" line, indicating that the component contains no further ports for extraction. Upon recognition of the "end component" statement, processor 12 terminates the extraction process for the particular component. At this time, as indicated by loop 122 and block 124, processor 12 determines whether it has reached the end of the package file or hardware description language file, as applicable. If not, processor 12 repeats the process by finding the next component and generating an expected port list. If it has reached the end of the file, however, processor 12 has generated expected port lists for all components in the file, and terminates the process, as indicated by block 126. In either case, processor 12 stores the expected port lists, e.g., in memory 14, for subsequent use in the analysis of the module port lists. The process described with reference to FIG. 5 represents one exemplary mode for generating the expected port lists necessary for the verification process. However, other approaches may occur to those skilled in the art having benefit of the present disclosure.

Figure 6:
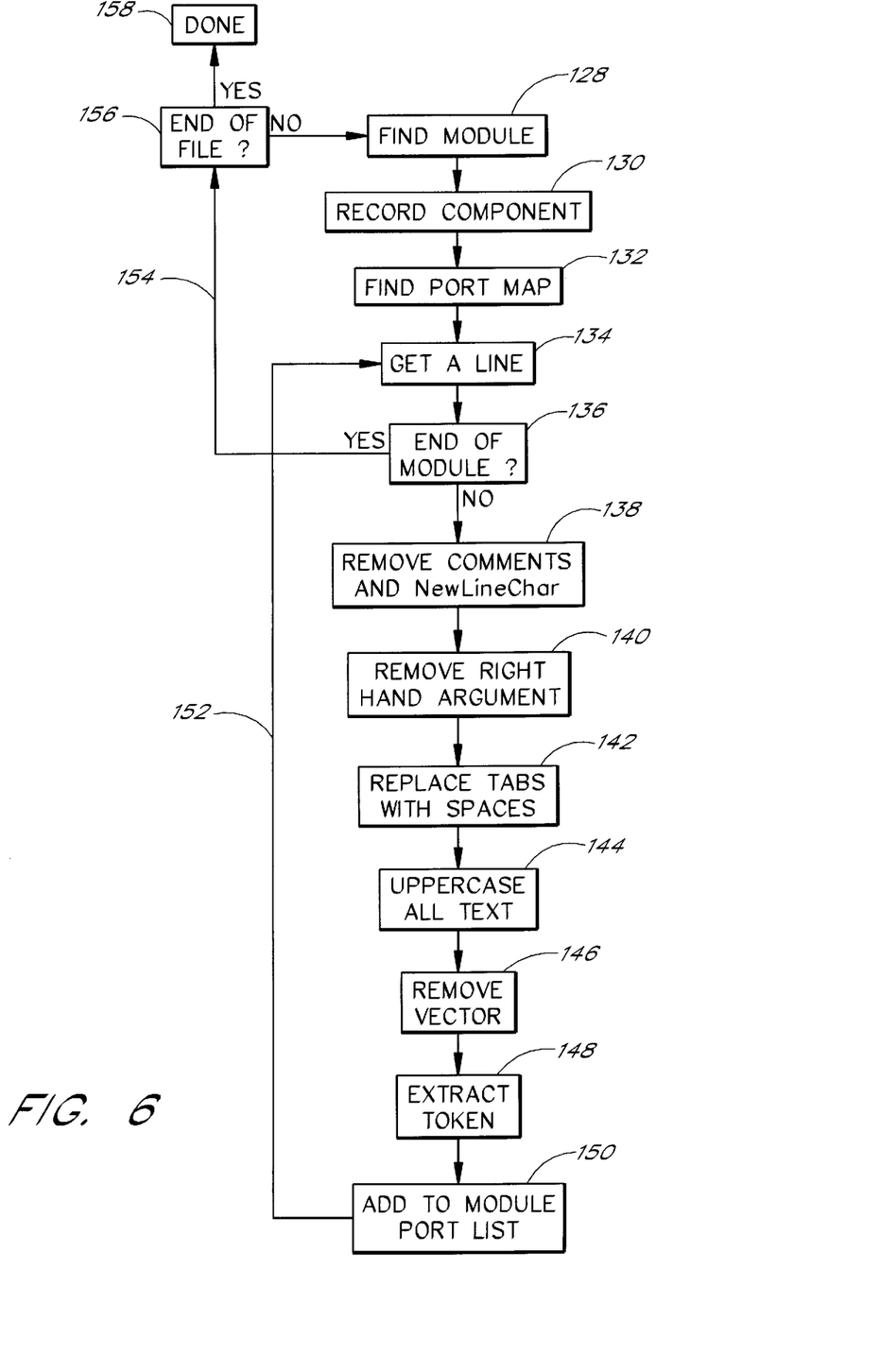
FIG. 6 is a flow diagram illustrating a method for extracting a module port list for use in a method as shown in FIGS. 2 and 3.

FIG. 6 is a flow diagram illustrating a method for extracting a module port list for use in a method as shown in FIGS. 2 and 3. Once expected port lists have been assembled, e.g., by reference to component port lists, it is still necessary to assemble module port lists for comparison. Processor 12 can assemble the module port lists in a manner very similar to assembly of the expected port lists. With reference to FIG. 6, for example, processor 12 first scans a hardware description language file to identify module declarations, each of which instantiates a particular component. For ease of description, an example of a module declaration is set forth below:

---
Mod0: CompX
   port map (
      A_in(3 downto 0) => sigA;    --A
      B_out => sigB    --B
   );

---

Once processor 12 finds a module, as indicated by block 128, it records the name of the component instantiated by the module, as indicated by block 130. In the above example, processor 12 records the name "CompX." As indicated by block 132, processor 12 next identifies the "port map" statement within the module declaration. Processor 12 then gets from the module declaration a line of code following the port map statement, as indicated by block 134. In a first iteration, processor 12 gets the first line following the "port" statement. In subsequent iterations, processor 12 gets successive lines. Processor 12 next determines whether the line contains the ");" string, as indicated by block 136; which indicates the end of the module. In a first iteration, with the example module declaration above, processor 12 obtains the following:

---
    A_in(3 downto 0) => sigA;    --A

---

The ");" string would indicate that no further lines remain in the body of the module, and typically would be separated from the "port map" statement by one or more lines of code. If the next line is not the ");" string, processor 12 next removes all comments and new line characters, as indicated by block 138. Again, comments can be identified by reference to the "—" characters. After removing comment and new line characters, processor 12 yields the following remaining characters:

A_in(3 downto 0)→sigA;

As indicated by block 110, processor 12 replaces all tabs with spaces, as applicable. Processor 12 removes the right hand argument ("→sigA") of the line, as indicated by block 140, replaces all tabs with spaces, as indicated by block 142, and converts all remaining text to uppercase, as indicated by block 144, yielding:

A_IN(3 DOWNTO 0)

Processor 12 then removes the vector "(3 DOWNTO 0)," as indicated by block 146, such that the line of code is reduced to:

A_IN

With the module declaration reduced as described above, processor 12 extracts the remaining code as a token representative of a port, as indicated by block 148, and adds the token to the module port list, as indicated by block 150. Addition of the token to the module port list establishes it as a port for verification against the expected port list assembled for the component instantiated by the module.

After the token has been added to the module port list, processor 12 returns for another extraction cycle, as indicated by loop 152. In a second extraction cycle directed to the module declaration of this example, processor 12 repeats the acts indicated by blocks 134, 136, 138, 140, 142, 144, 146, 148, and 150 to extract the "B_OUT" token and add it to the module port list. The resulting module port list in this example is "A_IN, B_OUT." In a third extraction cycle, processor 12 obtains the ");" line, indicating that the module contains no further ports for extraction. Upon recognition of the ");" string, processor 12 terminates the extraction process for the particular module.

After reaching the end of the module declaration, processor 12 determines whether it has reached the end of the hardware description language file, as indicated by loop 154 and block 156. If not, processor 12 repeats the process by finding the next module and generating an actual port list. If it has reached the end of the file, however, processor 12 has generated actual port lists for all modules in the file, and terminates the process, as indicated by block 158. In either case, processor 12 stores the module port lists in memory 14 for subsequent use in the analysis of the module port list relative to the corresponding expected port list. Like the process described with reference to FIG. 5, this process represents one exemplary mode for generating the module port lists necessary for the verification process.

Assuming that the port name "B_OUT" were missing from the exemplary module, the module would not operate properly, possibly disrupting the overall simulation based on the hardware description language file. Specifically, the module would be missing a connection, and therefore fail to properly interface with other modules in the design. To quickly identify the potential error for the user, processor 12 can drive output device 18 to highlight the missing port in a variety of ways as described above. For purposes of illustration, processor 12 can present an edited module via output device 18 such that an original module:

```
Mod0: CompX
    port map (
        A_in(3 downto 0) => sigA        --A
    );
``` in which the "B_out" port name is missing from the module port list, is represented to the user as:

```
Mod0: CompX
    port map (
        A_in(3 downto 0) => sigA;       --A
        B_out => ?
    );
```

In this manner, processor 12 presents the user with the proposed correction of the module by adding the missing "B_out" port name to the module port list, e.g., in a bold, highlighted or redlined manner. At the same time, the "B_out" port name can be highlighted or redlined in the corresponding module declaration, which could be displayed, e.g., side-by-side with the module declaration or in another window. In one embodiment, the user can accept the proposed correction, decline it, or override it with other user-specified corrections. However, the user ordinarily must intervene to connect the port to an desired signal, as indicated by the question mark sign. In any event, the user is able to verify and correct the integrity of the module port lists to ensure proper simulation.

A number of embodiments of the present invention have been described. Nevertheless, it will be understood that various modifications may be made without departing from the spirit and scope of the invention. Accordingly, other embodiments are within the scope of the following claims.

What is claimed is:

1. A method of analyzing port lists in a hardware description language file, the method comprising:

accessing the hardware description language file, the hardware descriptions language file declaring components and modules representing instantiated components wherein each of the components includes a component port list including one or more ports and each of the modules includes a module port list including one or more ports;

selecting one of the components from the hardware description language file;

selecting one of the modules from the hardware description language file, wherein the selected module represents an instance of the selected component;

comparing the component port list for the selected component to the module port list for the selected module so as to verify whether said one or more ports in said component port list are present in said module port list; and generating an advisory in the event one or more of the ports in the component port list is missing from the module port list.

2. The method of claim 1, wherein the act of comparing further includes verifying whether each of the ports in the module port list is present in the component port list, and the act of generating further includes generating a second advisory in the event one or more of the ports in the module port list is missing from the component port list.

3. The method of claim 2, further comprising repeating the selecting act, the comparing act, and the generating act for each of the component port lists and module port lists in the hardware description language file.

4. The method of claim 1, further comprising determining whether the hardware description language file includes a package file that sets forth the components declared in the hardware description language file, wherein the act of selecting one of the components includes, in the event the hardware description language includes the package file, selecting one of the components from the package file.

5. The method of claim 1, further comprising executing the act of selecting one of the modules prior to the act of selecting one of the components.

6. The method of claim 1, further comprising executing the act of selecting one of the components prior to the act of selecting one of the modules.

7. The method of claim 1, wherein the hardware description language file is a VHDL file.

8. The method of claim 1, further comprising generating a proposed modification to the module port list in the event the module port list deviates from the component port list.

9. A computer readable medium encoded with a computer program, the program being arranged such that, when the program is executed, a computer performs the acts of:

accessing the hardware description language file, the hardware description language file declaring components and modules representing instantiated components, wherein each of the components includes a component port list including one or more ports and each of the modules includes a module port list including one or more ports;

selecting one of the components from the hardware description language file;

selecting one of the modules from the hardware description language file, wherein the selected module represents an instance of the selected component;

comparing the component port list for the selected component to the module port list for the selected module so as to verify whether said one or more ports in said component port list are present in said module port list; and generating an advisory in the event one or more of the ports in the component port list is missing from the module port list.

10. The computer readable medium of claim 9, wherein the act of comparing further includes verifying whether each of the ports in the module port list is present in the component port list, and the act of generating further includes generating a second advisory in the event one or more of the ports in the module port list is missing from the component port list.

11. The computer readable medium of claim 10, wherein the program is further arranged such that the computer repeats the selecting acts, the comparing act, and the generating act for each of the component port lists and module port lists in the hardware description language file.

12. The computer readable medium of claim 9, wherein the program is further arranged such that the computer determines whether the hardware description language file includes a package file that sets forth the components declared in the hardware description language file, and wherein the act of selecting one of the components includes, in the event the hardware description language includes the package file, selecting one of the components from the package file.

13. The computer readable medium of claim 9, wherein the program is further arranged such that the computer performs the act of selecting one of the modules prior to the act of selecting one of the components.

14. The computer readable medium of claim 9, wherein the program is further arranged such that the computer performs the act of selecting one of the components prior to the act of selecting one of the modules.

15. The computer readable medium of claim 9, wherein the hardware description language file is a VHDL file.

16. The computer readable medium of claim 9, wherein the program is further arranged such that the computer performs the act of generating a proposed modification to the module port list in the event the module port list deviates from the component port list.

17. A method of analyzing a module port list in a hardware description language file, the module port list defining one or more ports for an instantiated component, the method comprising:

selecting a module port list from a hardware description language file;

comparing the selected module port list to an expected port list which includes one or more ports so as to verify whether said one or more ports in said expected port list is present in said selected module port list; and generating an advisory in the event one or more of the ports in the expected port list is missing from the selected module port list.

18. The method of claim 19, wherein the act of comparing further includes verifying whether each of ports in the selected module port list is present in the expected port list, and the act of generating further includes generating a second advisory in the event one or more of the ports in the selected module port list is missing from the expected port list.

19. The method of claim 17, further comprising repeating the selecting act, the comparing act, and the generating act for each of a plurality of module port lists in the hardware description language file.

20. The method of claim 17, wherein the hardware description language file is a VHDL file.

21. A computer readable medium encoded with a computer program, the program being arranged such that, when the program is executed, a computer analyzes a module port list in a hardware description language file, the module port list defining one or more ports for an instantiated component, the computer performing the acts of:

selecting a module port list from a hardware description language file;

comparing the selected module port list to an expected port list which includes one or more ports so as to verify whether said one or more ports in said expected port list is present in said selected module port list; and generating an advisory in the event one or more of the ports in the expected port list is missing from the selected module port list.

22. The computer readable medium of claim 21, wherein the program is further arranged such that the computer performs the act of comparing further by verifying whether each of the ports in the selected module port list is present in the expected port list, and the act of generating by generating a second advisory in the event one or more of the ports in the selected module port list is missing from the expected port list.

23. The computer readable medium of claim 22, wherein the program is further arranged such that the computer repeats the selecting act, the comparing act, and the generating act for each of a plurality of module port lists in the hardware description language file.

24. The computer readable medium of claim 21, wherein the hardware description language file is a VHDL file.

* * * * *